United States Patent
Deurloo et al.

(10) Patent No.: US 10,063,228 B2
(45) Date of Patent: Aug. 28, 2018

(54) QUBIT CIRCUIT STATE CHANGE CONTROL SYSTEM

(71) Applicant: Nederlandse Organisatie voor toegepast-natuurwetenschappelijk onderzoek TNO, The Hague (NL)

(72) Inventors: Duije Deurloo, The Hague (NL); Leonardo Dicarlo, The Hague (NL)

(73) Assignee: Nederlandse Organisatie voor toegepast-natuurwetenschappelijk onderzoek TNO, The Hague (NL)

( * ) Notice: Subject to any disclaimer, the term of this patent is extended or adjusted under 35 U.S.C. 154(b) by 0 days.

(21) Appl. No.: 15/552,066

(22) PCT Filed: Feb. 19, 2016

(86) PCT No.: PCT/NL2016/050122
§ 371 (c)(1),
(2) Date: Aug. 18, 2017

(87) PCT Pub. No.: WO2016/133394
PCT Pub. Date: Aug. 25, 2016

(65) Prior Publication Data
US 2018/0013426 A1    Jan. 11, 2018

(30) Foreign Application Priority Data

Feb. 19, 2015  (EP) .................................... 15155829
Feb. 20, 2015  (EP) .................................... 15156027

(51) Int. Cl.
*H03K 17/92*  (2006.01)
*H03K 17/693*  (2006.01)

(52) U.S. Cl.
CPC ........... *H03K 17/92* (2013.01); *H03K 17/693* (2013.01)

(58) Field of Classification Search
CPC ..................................................... H03K 17/92
See application file for complete search history.

(56) References Cited

U.S. PATENT DOCUMENTS 7,876,145 B2   1/2011  Koch
8,111,083 B1   2/2012  Pesetski et al.
(Continued)

FOREIGN PATENT DOCUMENTS

WO    2014028302 A2    2/2014

OTHER PUBLICATIONS

International Search Report PCT/NL2016/050122 dated Jan. 7, 2016.
(Continued)

*Primary Examiner* — Jeffrey Zweizig
(74) *Attorney, Agent, or Firm* — Pillsbury Winthrop Shaw Pittman, LLP (57) ABSTRACT

A qubit system is provided wherein successive sets of M RF pulses are generated simultaneously, for application to qubit circuits in a plurality of N groups of M qubit circuits. M switching multiplexer circuits are used, each to pass a respective one of the M RF pulses in the set to a selected one of a plurality of N M to one RF combiners in a multiplexing mode. Combined RF pulses at M different RF frequencies are transmitted from each of the N combiners to a transmission structure for a respective one of the groups. Individual ones of the combined RF pulses are coupled from the transmission structure for the group to respective ones of the qubit circuits of the groups via respective frequency selective filters. In a broadcast mode the M switching multiplexer circuits are used to transmit the simultaneous pulses to all of RF combiners.

12 Claims, 3 Drawing Sheets

(56) References Cited

U.S. PATENT DOCUMENTS

| | | |
|---|---|---|
| 9,369,133 B2 * | 6/2016 | Naaman ............. H03K 19/1958 |
| 9,438,246 B1 * | 9/2016 | Naaman ............... H03K 19/195 |
| 2009/0014714 A1 | 1/2009 | Koch |
| 2009/0015317 A1 | 1/2009 | DiVincenzo et al. |

OTHER PUBLICATIONS

David Isaac Schuster, "Circuit Quantum Electrodynamics", A Dissertation Presented to the Faculty of the Graduate School of Yale University in Candidacy for the Degree of Doctor of Philosophy, May 2007, 255 pgs.

Nielson et al., "Quantum Computation and Quantum Information", Cambridge University Press, 2000, 698 pgs.

\* cited by examiner

QUBIT CIRCUIT STATE CHANGE CONTROL SYSTEM

CROSS-REFERENCE TO RELATED APPLICATIONS

This is the U.S. National Stage of PCT/NL2016/050122, filed Feb. 19, 2016, which claims priority to European Application No. 15155829.3, filed Feb. 19, 2015, and to European Patent Application No. 15156027.3, filed Feb. 20, 2015, the contents of each of these applications being incorporated herein by reference in their entireties.

FIELD OF THE INVENTION

The invention relates to a qubit circuit system, and a quantum computation circuit comprising such a qubit circuit system.

BACKGROUND

A qubit circuit is a circuit wherein two quantum states can coexist in quantum superposition states and that supports computational use of the two quantum states as representations of logical 0 and 1 states. Various examples of qubit circuits are known under the names of Cooper pair box, Transmon, Quantronium, Fluxonium, etc. US2009015317 discloses examples of qubit circuits. The disclosure of the qubit circuit in this document is incorporated herein by reference. In most instances the qubit circuit comprises a superconducting resonant RF circuit with a resonance frequency in the microwave range, for example in a range of 1-10 Gigahertz and preferably a Josephson junction in this structure. In quantum computation circuits qubit circuits are used as elements for processing and storing superimposed information.

It is known to transmit RF pulses to qubit circuits to control state changes and/or measure states. An RF pulse generation is used to apply RF pulses to the input of such a qubit circuit, for example via a microwave transmission line that is capacitively coupled to the qubit circuit. For example, the transmission may comprise using the RF pulse to generate a superimposed electromagnetic field on a field in part of the superconducting resonant RF circuit. The frequency of the RF signal in the pulse is related to the resonance frequency of the qubit and may be in the Gigahertz range (although it need not be equal to that resonance frequency). The state change of the qubit depends on the shape of the pulse, its amplitude and the phase of the undulations in the RF pulse (the undulations may correspond to RF oscillations upon which the RF pulse has been modulated). Moreover, pulse shapes of in-phase and quadrature components of the RF pulse may to be controlled to avoid undesired state changes.

A series of successive RF pulses may be used to perform successive state changes. By setting the amplitudes and relative phase of RF pulses in such a series, a selectable series of operations may be performed on the qubit. A control system may be used that stores definitions of sets of such parameters for predefined RF pulses and a "program" that indicates which of these predefined RF pulses must be transmitted in the series. In a qubit system with a plurality of qubits, a control system selects the amplitude and phase of the RF signal in an RF pulse for different qubits dependent on the desired state changes.

Manufacturing tolerance may detrimentally affect the usefulness of qubit circuits in quantum computation circuits. Manufacturing tolerance can result in inaccuracy of state changes and insufficient effectiveness of suppression of undesired state transitions. Noise can reduce the coherence time of the qubit. To compensate for manufacturing tolerances, slightly different amplitude and/or phase settings may be needed for RF pulses to different individual qubits to affect the same state changes.

It is known to use independent RF pulse generators in a multi-qubit system to generate the RF pulses with controlled amplitude and phase for the individual qubits. In this way, calibration of the RF pulse generators can be used to account for the effects of manufacturing tolerances. Calibration may be performed for example by applying one or more RF pulses to each qubit and measuring the effect of the RF pulses. RF pulses with different amplitudes and/or phase may be applied to each qubit during calibration to measure a responses of individual qubits as a function of amplitudes and/or phase and the amplitudes and/or phase corresponding to a predetermined desired response may be used to control the setting of the adapters. Moreover, with independent RF pulse generators arbitrary combinations of pulses can be applied to different qubits simultaneously, which makes it possible to make optimum use of the coherence time. However, this solution requires that a large number of RF pulse generators be used in a qubit system with a large number of qubits. With increasing numbers of RF pulse generators this will to high equipment costs and also to increasingly significant heat leak, because the RF pulse generators conventionally operate at room temperature and transmission lines have to be provided to the superconducting qubits that operate at very low temperature (e.g. cryogenic temperatures).

US 20090014714 discloses a control system architecture for quantum computing. The document addresses the problem of multiplexing signals at low temperature. The document uses a 2-d matrix of quantum circuits such as qubit circuits. The matrix has column conductors, each coupled to the qubits in a respective column of the matrix, to apply a bias signal to the qubits circuits in the column. Furthermore the matrix has row conductors, each coupled to the qubits circuits in a respective row of the matrix, for applying microwave pulses to the qubits circuits in the row. In this way, if there are M columns and N rows, i.e. N*M qubit circuits, N transmission lines for control signals suffice to address the control signals to all of the N*M qubit circuits individually on a time division multiplexing basis. However, resonance frequency discrepancies between different qubits can detrimentally affect the performance of such a qubit matrix. Furthermore, compared with the solution using individual RF pulse generators for individual qubits, the number of RF pulses that can be applied simultaneously is significantly reduced, so that some tasks that could be executed with the same number of qubits using individual RF pulse generators cannot be executed with such a matrix within a time distance that is smaller than the coherence time.

SUMMARY

Among others, it is an object to provide for a qubit system wherein the circuit for controlling qubit circuit does not scale in proportion to the total number of qubits.

According to one aspect a qubit circuit state change control system according to claim 1 is provided. This system used a combination of time domain multiplexing and frequency domain multiplexing. A plurality of M time domain multiplexing systems is used, each with an RF pulse generator for a different frequency and an 1 to N RF multiplexer. N groups of M qubits are used, the M qubits of each group receive RF signals from a common transmission structure for that group, such as a transmission line. The transmission structure is coupled to different ones of the qubit circuits in the group via respective frequency selective filters.

In each time domain multiplexing system, each of the N multiplexed output transmission lines of the set of N multiplexed output transmission lines corresponds to a respective one of the N groups. Each group has its own RF combiner, which couples the common transmission structure for the group to the corresponding multiplexed output transmission lines from the M time domain multiplexing systems.

A control circuit is used that configured to controls pulse generation and the selection by the 1:N RF multiplexers of the M time domain multiplexing systems. In this way, the control circuit can select to which one of the N common transmission lines of the N respective groups an RF pulse from each RF pulse generator will be transmitted. As a result the state of the qubit with the frequency selective filter coupled to that common transmission line will be changed. In this way, state changes of M*N qubits can be controlled using M RF pulse generators. State changes to any combination of M of the M*N qubits can be applied at a time.

According to a further aspect the system according to claim 2 is provided. Herein a broadcast mode wherein the multiplexer transmits an RF pulse to all N output transmission lines of its time domain multiplexing system simultaneously. In this way, when the multiplexers of one of the M time domain multiplexing systems is in the broadcast mode, a set of simultaneously transmitted RF pulses from the M RF pulse generators will reach qubits with frequency selective filters for the frequency of the time domain multiplexing system in all of the groups. When the multiplexers of all M time domain multiplexing systems are in the broadcast mode, a set of simultaneously transmitted RF pulses from the M RF pulse generators will reach all N*M qubits.

In a further embodiment a multicast mode may be supported, wherein the multiplexer transmits an RF pulse to a subset of N' (N'>1) of all N output transmission lines of its time domain multiplexing system simultaneously dependent on control by the control circuit. According to another aspect the system according to claim 3 is provided. The amplitude adapters provide for compensation for the differences between the amplitude values that are needed to affect a same state change in different qubits. This makes it possible to use qubit independent RF pulse generation by an RF pulse generator. In particular when the broadcast or multicast mode is used this makes it unnecessary to use qubit circuits that are exactly matched: the amplitude adapters enable compensation for qubit circuits that do not match, for example due to manufacturing tolerance. Optionally phase adapter circuits may be provided in series with the amplitude adapter circuits. These may be used to compensate for path length differences, such as path length differences between In phase and Quadrature signals and to keep these orthogonal at each individual qubit and so preventing unwanted projections. The control circuit is configured to set the amplitude/phase changes of the amplitude/phase adapters differently according to manufacturing differences. These settings need to be changed at most when the qubits are recalibrated.

In an embodiment N*M controllable amplitude adapters and optionally phase adapters are used, one amplitude adapter (+phase adapter) for each multiplexer output. This results in a one to one relation between the controllable amplitude adapters and the N*M qubits, in the sense that all RF pulses that change the state of a particular qubit must pass through a single particular amplitude/phase adapter.

According to another aspect the system according to claim 4 is provided. Application of a combination of pulses to a qubit circuit may be used to suppress undesired state transitions. For example, a Gaussian pulse with in-phase local oscillator signal and a derivative of Gaussian with a quadrature local oscillator signal may be used. The required ratio between the amplitudes of these pulses may depend on individual cells due to manufacturing tolerances, The amplitude adapter circuits compensate this ratio after the multiplexers. Optionally, controllable phase adapter circuits may be used in series with the amplitude adapter circuits, to compensate for phase tolerance. Because the ratio compensation and optionally phase difference compensation is performed after multiplexing, it becomes possible to use qubit independent RF pulse generation by an RF pulse generator. In particular when the broadcast or multicast mode is used this makes it unnecessary to use qubit circuits that are exactly matched.

BRIEF DESCRIPTION OF THE DRAWINGS

These and other objects will become apparent from a description of exemplary embodiments with reference to the following figures.

DETAILED DESCRIPTION OF EXEMPLARY EMBODIMENTS

Multiplexed RF signal generation is known per-se from the general field of RF technology. In a time domain multiplexing system an RF multiplexer may be used to connect a single RF pulse generator to a plurality of N transmission lines and a control circuit controls the RF multiplexer to supply successive RF pulses to successively selected ones of the N transmission lines. Thus, only a single RF pulse generator is needed for a plurality of N transmission lines.

In a frequency domain multiplexing system concurrent RF pulses at a plurality of M different RF frequencies are generated on a single transmission line and M frequency selective filters are used to receive the different pulses at different receivers. In a frequency domain multiplexing system M different RF pulse generators may still be used to generate the RF pulses at M different frequencies, but the number of transmission lines is reduced, because a plurality of receivers is coupled to a single transmission line. In this case, the different RF pulse generators may be coupled to the single transmission line via a combiner.

When time domain multiplexing is applied to qubits, N different qubits are coupled to N different transmission lines of the time domain multiplexing system. The control circuit controls the amplitude and phase in successive time slots, in each time slot according to the desired state change for the individual qubit that is coupled to the transmission line during the time slot. In this way, a single RF pulse generator can be used to provide pulses for a plurality of qubits.

When frequency domain multiplexing is applied to qubits, different qubits are all coupled to a single transmission line of a frequency domain multiplexing system. Different ones of the qubits are coupled to the transmission lines via respective different frequency selective filters. The control circuit controls the amplitude and phase for RF pulses at different frequencies concurrently, at each frequency according to the desired state change for the individual qubit that is coupled to the transmission line via the filter for that frequency. In this way, a single transmission line can be used to provide pulses for a plurality of qubits.

Figure 1:
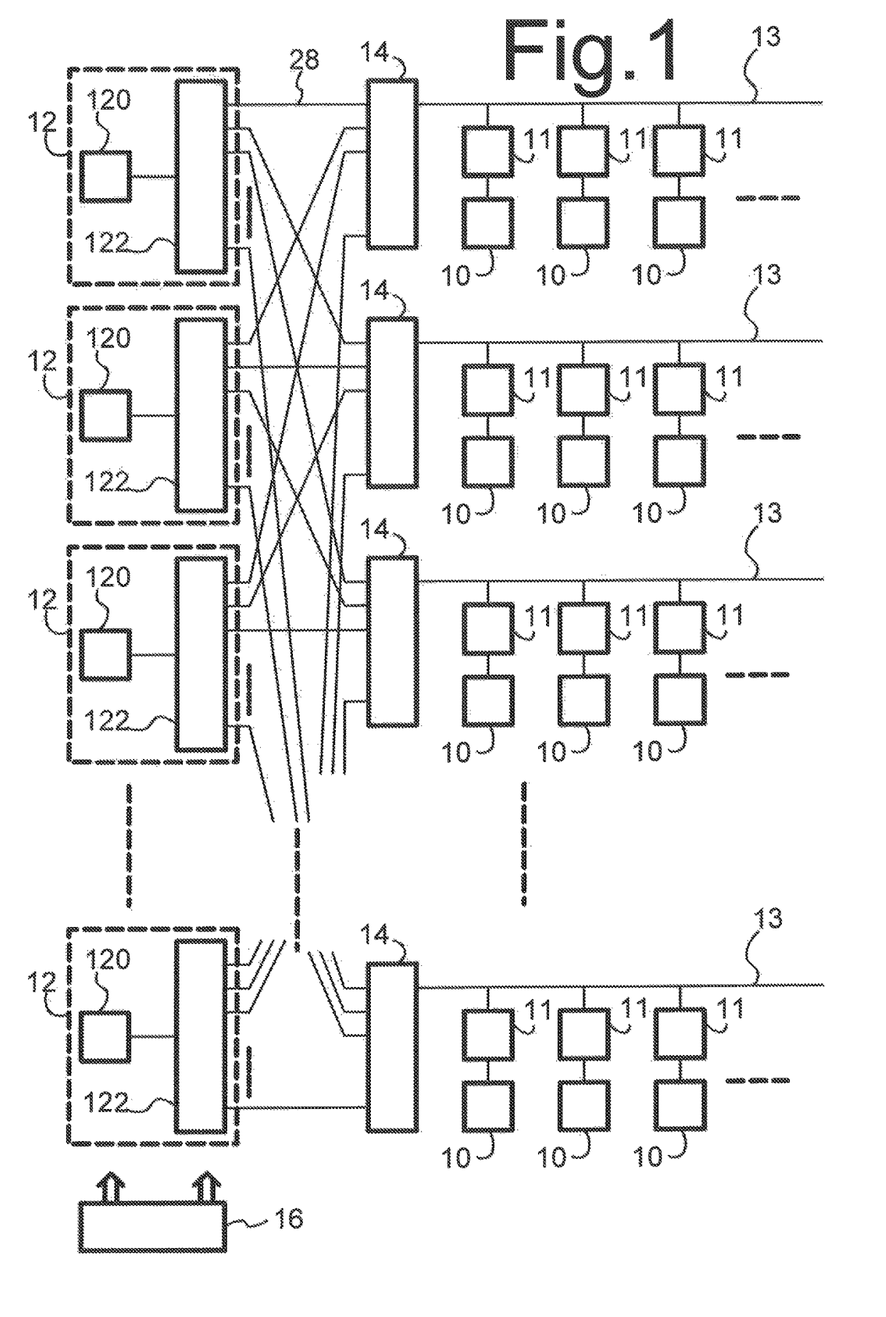
FIG. 1 shows a qubit system

FIG. 1 shows a qubit system, comprising a control circuit 16, a plurality of time division multiplexing systems 12, a plurality of M to 1 couplers 14, a plurality of group transmission lines 13, a plurality of frequency selective filters 11 and a plurality of qubit circuits 10. Control circuit 16 has control outputs coupled to time division multiplexing systems 12. A plurality of M time division multiplexing systems 12 may be used (M is an integer greater than one; by way of example the figure shows only four time division multiplexing systems 12). Each of the M time division multiplexing systems 12 comprises an RF pulse generator 120 (e.g. a shaped pulse generator) and an RF multiplexer 122 with a plurality of N output transmission lines 28 (only one labeled). N may be any integer greater than one; N need not be equal to M; by way of example the figure shows only four output transmission lines. The fact that RF multiplexer 122 is termed a 1:N multiplexer does not exclude that it may have more than N output transmission lines. RF pulse generator 120 is configured to generate RF pulses, in successive time slots, for example pulses containing undulations at a frequency in a frequency range of 1-10 GHz, with a Gaussian shaped envelope and a pulse duration of 10-40 or 20-40 nanoseconds in time slots of 100 nanoseconds. The RF pulse generators 120 of different ones of the time division multiplexing systems 12 are configured to generate pulses containing RF undulations at mutually different frequencies. Control circuit 16 has outputs coupled to control inputs (not shown) of RF pulse generators 120 for controlling the phase and amplitude of the RF pulses.

Figure 2:
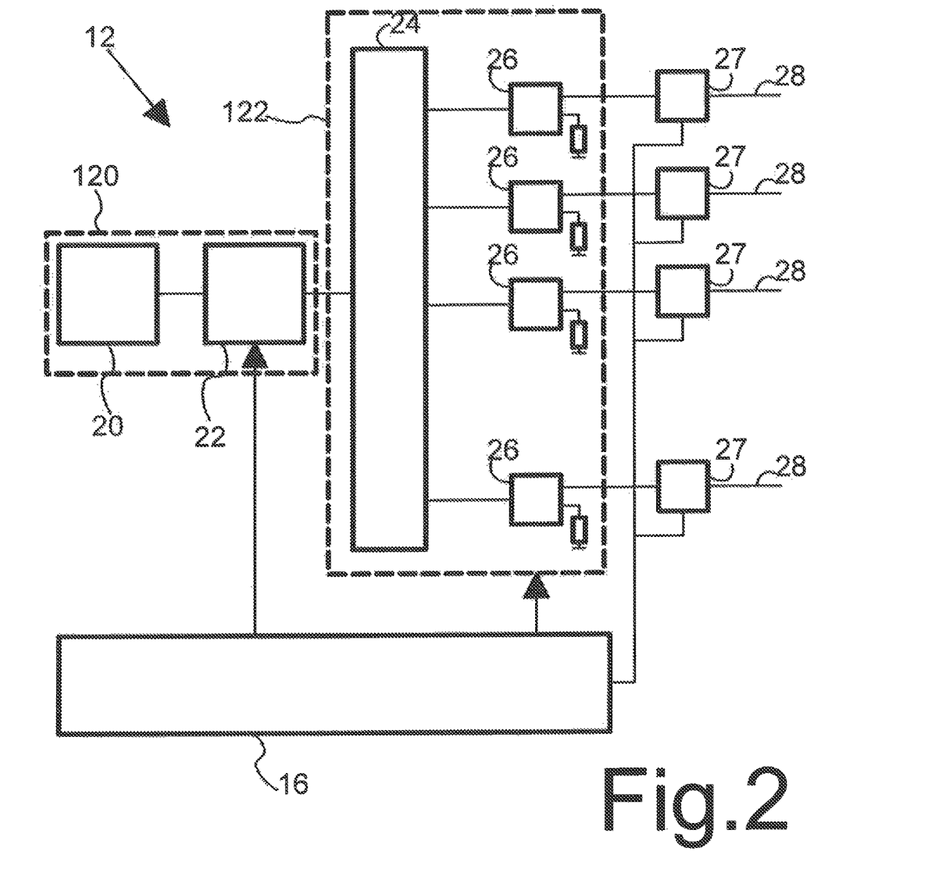
FIG. 2 shows a time division multiplexing circuit

RF pulse generator 120 has an RF output coupled to RF multiplexer 122. RF multiplexer 122 may comprise a 1 to N splitter (not shown) and FET switches (e.g. GaAs FET switches not shown) coupled between respective ones of the outputs of the 1 to N splitter and respective ones of the output transmission lines. Such a structure is illustrated in FIG. 2. Preferably, the switches are each configured to switch between coupling a respective one of the outputs of the 1 to N splitter to an output transmission line from RF multiplexer 122 or to a termination load. Control circuit 16 has outputs coupled to control inputs of the switches (not shown). The output transmission lines from RF multiplexer 122 may be coaxial cables, strip line transmission lines, waveguides or any other type of transmission lines. Each of the N output transmission lines from an RF multiplexer 122 is coupled to an input of a respective different one of the M to 1 couplers 14. This is the case for each of the M multiplexing systems 12. There are N M-to-1 couplers 14, each with M inputs coupled to M different ones of the M time division multiplexing systems 12. The fact that RF combiners 14 are referred to as M to 1 combiners does not exclude that they may have more than M inputs.

M to 1 couplers 14 each have an output coupled to a respective one of the group transmission lines 13. There are N group transmission lines 13. Group transmission lines 13 are called "group" transmission lines 13 because each is coupled to a group of qubit circuits 10. To each of the N "group" transmission lines 13 M qubit circuits 10 have been coupled. In total there are N times M qubit circuits 10.

Each qubit circuit 10 is coupled to the group transmission line via a respective frequency selective filter 11 that passes a respective one of the frequencies of the M time division multiplexing systems 12. In one embodiment each frequency selective filter 11 may comprise a filter transmission line coupled to a group transmission line 13 and a qubit circuit 10, e.g. via a capacitive coupling, and a half wavelength conductor shorted at both ends that is coupled to the filter transmission line e.g. because it runs adjacent the filter transmission line. However, any known frequency selective filter structure may be used.

Transmission lines 13 are an example of a transmission structure that is preferably used, but instead more complicated transmission structures can be used that function to transmit RF pulses to all frequency selective filters. For example, a more complicated transmission structure may comprise RF splitters to distribute the same RF pulse to all frequency selective filters through a tree structure, and/or attenuators or even amplifiers may be present in the transmission structures for transmitting attenuated or amplified RF pulses. The 1 to N multiplexers 122, output transmission lines 28 and combiners form switchable RF signal paths from the RF pulse generators 120 to the group transmission structures 13, Although not shown, the qubit system may also comprise group output transmission lines coupled to the qubit circuits 10 of the group, preferably via further frequency selective filters. Furthermore, bias conductor lines may be provided for biasing qubit circuits 10. Biasing may be performed by applying an electric current along a Josephson junction of the qubit circuit 10. Biasing may be used to tune the qubits according to the undulation frequencies of the relevant RF pulse generators. Tuning may be performed at a much lower frequency than that of the time slots. Alternatively, a bias conductor line may be coupled to a set of qubit circuits 10, in which case tuning may be adjusted per timeslot, according to the selected qubit circuits 10.

At least qubit circuits 10 are preferably located in a cooling unit (not shown, but e.g. comprising a thermally isolated vessel for containing low temperature liquid and a thermal conductor between qubit circuits 10 and the space for the liquid; the cooling unit may be cryogenic cooling unit) to maintain qubit circuits 10 at a temperature at which its conductors are superconductive. Part or all of the remaining part of the system may be located outside this cooling unit. Preferably, RF attenuators (not shown) are provided in the cooling unit in the RF path(s) between the part of the system outside the cooling unit and qubit circuits 10 that are inside the cooling unit, in order to reduce thermal noise substantially to the level corresponding to the temperature in the cooling unit.

In operation, control circuit 16 causes time division multiplexing systems 12 to transmit successive RF pulses, each in a successive time slot, each time division multiplexing system 12 transmitting pulses containing a different RF frequency. By way of example, the duration of the pulses may be in a range of 10-100 nanoseconds (e.g. 20-40), with longer time slot duration, i.e. in the range of 50-500 nanosecond (e.g. 100-200) and pulse undulation frequency in a range of 500 MHz to 20 GHz (e.g. 4.8 GHz).

Furthermore, for each time slot wherein the system operates in a multiplexing mode, control circuit 16 selects an output transmission line and for time division multiplexing systems 12. Control circuit 16 controls each RF multiplexers 122 to transmit the RF pulse to the selected output transmission line. The M to 1 couplers 14 transmit the RF pulses to group transmission lines 13. Frequency selective filters 11 pass the RF pulses with their pass frequencies to qubit circuits 10. Thus each time M qubit circuits 10 will receive RF pulses in the same time slot, control of RF multiplexers 122 determining independently for each of the M frequencies the group wherein the receiving qubit circuit 10 is located.

In an embodiment, the system also supports use of a broadcast mode. In the broadcast mode, each M time division multiplexing system 12 transmits RF pulses simultaneously to all of its N output transmission lines. Control circuit 16 may be configured to select between using the broadcast mode or the multiplexing mode for each time slot individually and to apply a corresponding control signal or control signals to RF multiplexers 122. In this embodiment, RF multiplexers 122 are designed to pass RF pulses to selected ones of the N output transmission lines, or to all N output transmission lines under control of the selection signal from control circuit 16.

FIG. 2 shows an example of a time division multiplexing circuit wherein RF multiplexer 122 comprises a one to N RF signal splitter 24 and N controllable RF switches 26, coupled between respective outputs of the splitter 24 and respective ones of the N output transmission lines 28. In this case, control circuit 16 may have control outputs (shown symbolically by an arrow) coupled to control inputs of the N controllable RF switches 26 each time in successive time slots. Control circuit 16 may be configured to control all N controllable RF switches 26 to transmit split versions of an RF pulse simultaneously to all N output transmission lines 28 in the broadcast mode. Control circuit 16 may be configured to control a selected one of the N controllable RF switches 26 to transmit a split versions of the RF pulse to one of the N output transmission lines 28 in the multiplexing mode, while controlling the other N−1 controllable RF switches 26 to block such transmission. By way of example controllable RF switches 26 are shown that switch between coupling outputs of splitter 24 to a matched load or transmitting the RF signal.

Although a specific type of multiplexer has been shown, it should be appreciated that a broadcast mode may be realized with other multiplexer designs as well, for example with a tree of one to two multiplexers, each with a 1:2 splitter and two RF switches. Use of the broadcast mode makes it possible to increase the total number of RF pulses that can be used within a time distance that is less than the coherence time. The broadcast mode may be used for example to effect state changes, such as performing data shifting, in one or two dimensional surfaces (a so called surface code).

A possible problem may arise as a result of discrepancies between qubit circuits 10 due to manufacturing tolerances. In an embodiment wherein only the multiplex mode is used, this could be solved by configuring control circuit 16 to control RF pulse generator 120 to generate the RF pulse with parameters set dependent on both the required state change and the required adjustment for the particular qubit circuit 10 for which the RF pulse is intended (i.e. the qubit circuit 10 with the filter 11 for the frequency of the RF pulse on the group transmission line 13 to which the RF pulse will be routed by RF multiplexer 122).

The time division multiplexing circuit of FIG. 2 illustrates a different solution, wherein the required adjustment for the particular qubit circuit 10 is made by means of amplitude adapters 27 located in the RF signal paths from RF multiplexer 122 to the output transmission lines 28 of the time division multiplexer before the combiners (not show) for the group transmission lines (not shown). Thus, amplitude adapters 27 are located in the RF signal paths from the RF pulse generators to the group transmission structures between the multiplexers and the combiners, In an embodiment each amplitude adapter 27 comprises a FET, e.g. a GaAs FET, configured as a variable resistance, but any other type of amplitude adapter device may be used. In addition to amplitude adapters 27, controllable phase adapters (not shown) may be coupled in series with amplitude adapters 27.

Control circuit 16 has control outputs coupled to control inputs of amplitude adapters 27, for controlling amplitude adaption by amplitude adapters 27 according to properties of the qubit circuits. The required amplitude adaption may be determined in a calibration step. It may be noted that amplitude adapters 27 are in one to one correspondence with qubit circuits: the RF signal from each amplitude adapter 27 will always reach a same qubit circuit, if any. The setting of the required amplitude adaption may be made once for a series of time slots rather than on a time slot to time slot basis. Use of amplitude adapters 27 behind RF multiplexer 122 makes it possible to operate in the broadcast mode with amplitude adaption for individual qubits to compensate for manufacturing tolerances. Optionally, controllable phase adapters may be used to compensate for amplitude adaptation on the phase and/or path length differences in the paths that contain different RF output lines 28.

Although amplitude adapters 27 are shown in FIG. 2 in combination with a specific design of RF multiplexer 122, it should be appreciated that any design may be used in combination with amplitude adapters 27.

The time division multiplexing circuit of FIG. 2 illustrates an embodiment of RF pulse generator 120 that comprises a local oscillator 20 and a mixer 22 coupled between local oscillator 20 and RF multiplexer 122. Local oscillator 20 is operable at the undulation frequency of the RF pulses. Control circuit 16 has a modulation signal output coupled to an input of mixer 22, for supplying a modulation signal to define RF pulse properties.

Preferably, mixer 22 is a single side band mixer. Such a mixer may comprise sub-mixers for amplitude modulating in-phase and quadrature components of a signal from local oscillator 20 using real and imaginary components of the modulation signal and a combiner to combine the modulated in-phase and quadrature signals before transmitting them to RF multiplexer 122. Although local oscillator 20 and mixer 22 are shown in FIG. 2 in combination with a specific design of RF multiplexer 122 and amplitude adapters, it should be appreciated that any type of RF pulse generator 120 may be used in combination with amplitude adapters 27 and any RF multiplexer design.

Figure 3:
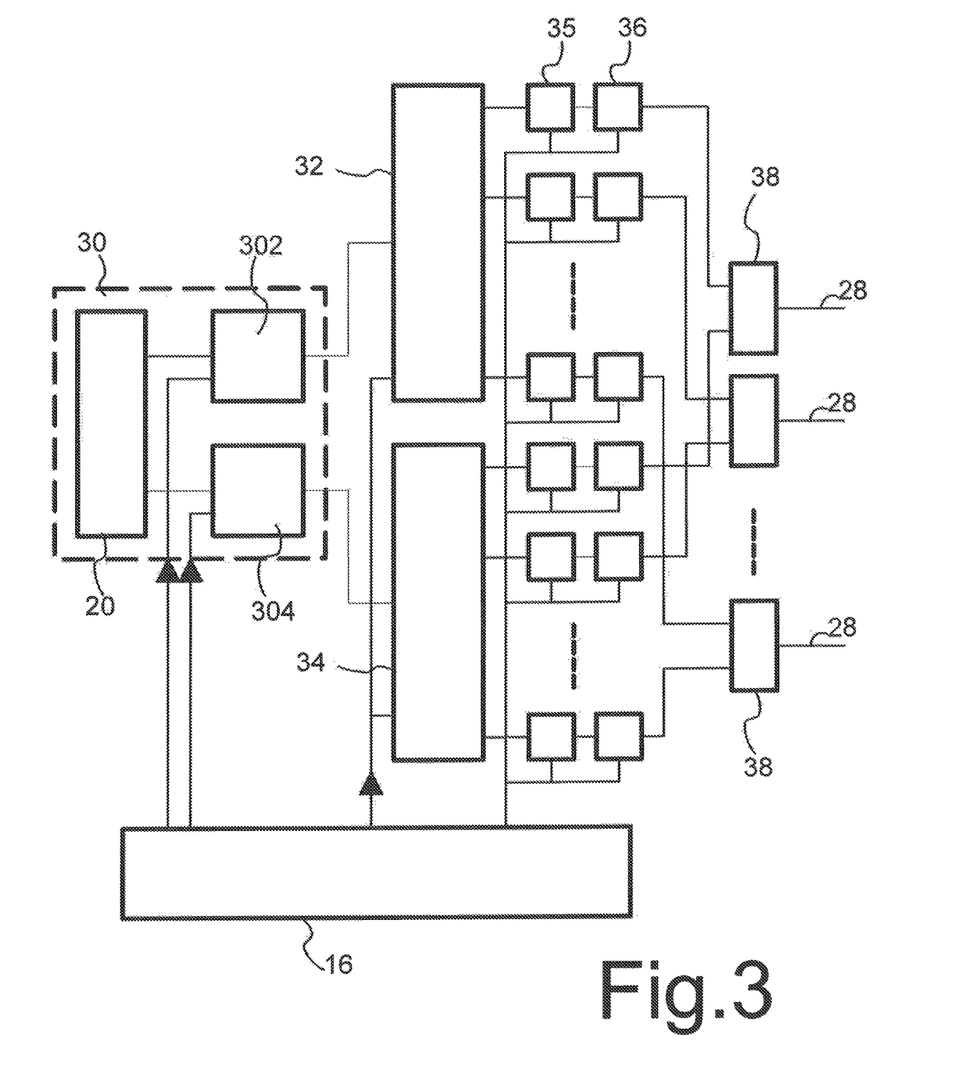
FIG. 3 shows a further multiplexing circuit

FIG. 3 shows an example of a multiplexing circuit wherein an RF pulse generator 30 is used that is configured to provide a first and second modulated RF pulse signal. Dependent on the properties of qubit circuits in general, such signals may be used defined to prevent undesired state changes. Signals for this purpose are known per se. In an embodiment a Gaussian pulse envelope and a derivative of Gaussian pulse envelope may be used for the first and second RF pulse signals respectively.

The first and second RF pulse signals (e.g. the in-phase (I) and quadrature (Q) signals) will be applied to qubit circuits together. Nevertheless, as shown in FIG. 3, they are combined in combiners 38 only after RF multiplexers 32, 34 and controllable amplitude adapters 35 and optional controllable phase adapters 36. This makes it possible to perform independent adaptions of the amplitudes and optionally the relative phase of the first and second RF pulses dependent on the qubit circuit for which the RF pulses are intended. As in the embodiment of FIG. 2, the adaptation may be set once for a plurality of time slots based on a calibration. The individual adaptation makes it possible to compensate for the effect of manufacturing tolerances on the prevention of undesired state changes.

In FIG. 3, RF pulse generator 30 comprises a local oscillator 20 and a first and second mixer 302, 304 coupled to in-phase and quadrature outputs of local oscillator 20. Control circuit 16 has modulation outputs coupled to inputs of first and second mixers 302, 304. First and second mixer 302, 304 are preferably single side band (SSB) mixers. First and second mixer 302, 302 are coupled to inputs of a first and second RF 1:N multiplexer 32, 34. The outputs of RF multiplexers 32, 34 are each coupled to a respective series connection of controllable amplitude adapters 35 and optional controllable phase adapters 36 (labeled in only one series connection). The sequence of controllable amplitude adapters 35 and controllable phase adapters 36 in the series connection may be inverted. Thus, amplitude adapters 35 and optional phase adapters 36 are located in the RF signal paths from the RF pulse generators to the group transmission structures between the multiplexers and the combiners.

Outputs of the series connections are coupled to RF combiners 38. Each RF combiner 38 has a first input coupled to an output of first RF multiplexer 32 and a second input coupled to an output of second RF multiplexer 34, both via a series connection of a controllable amplitude adapter 35 and a controllable phase adapter 36. Outputs of the combiners 38 are coupled to further combiners (not shown) that combine pulse signals from M different time divisions multiplexing systems like that shown in FIG. 3. Although an embodiment is described wherein RF combiners 38 are discrete combiners, it should be appreciated that they may be part of the combiners that are coupled to the group transmission lines, or that they may be considered to be part of these RF combiners. In this case, the latter are 2*M to one combiners. As noted, a M to one combiner may have more than M inputs. In another embodiment, RF combiners 38 be located in the RF signal path behind the M to one combiners Control circuit 16 has outputs coupled to control inputs of RF multiplexers 32, 34, controllable amplitude adapters 35 and controllable phase adapters 36. Control circuit 16 is configured to control RF multiplexers 32, 34 in the same way in each time slots, using independently selected control for different time slots, in a multiplexing mode and optionally in a broadcast mode. Control circuit 16 is configured to control controllable amplitude adapters 35 and controllable phase adapters 36 in the same way during a plurality of time slots. Although N=3 series connection of controllable amplitude adapters 35 and optional controllable phase adapters 36 have been shown per RF multiplexer 32, 34, and N=3 combiners 38 and it should be appreciated that another number N of such units may be used. Preferably, control circuit 16 is configured to control both amplitude adapters 35, 36, so that the amplitude of all components can be controlled. But it may suffice to control only one, or to include an adapter after combiner 38 to control both at the same time.

Although control circuit 16 has been shown as a single box, it may comprise a plurality of sub-circuits for performing different control tasks. Control circuit 16 may comprise a computer for coordinating the tasks and performing part or all of the tasks under control of a computer program stored in a memory of the computer. In an embodiment this or another memory of the computer stores data that defines the setting of the amplitude adapters and/or phase adapters. The computer may be configured to write the settings to local control registers in the adapters via a communication bus.

In an embodiment, the part of the system behind combiners 14 may be located in a cooling unit (e. a cryogenic cooling unit) and combiners 14 may be located outside the cooling unit. Thus only N transmission lines for input RF pulses need to enter the cooling unit.

In another embodiment, the part of the system behind the RF pulse generators is located in the cooling unit and the RF pulse generators are located outside Thus only M transmission lines for input RF pulses need to enter the cooling unit.

Although embodiments have been discussed wherein the RF multiplexers may be operated selectively in a multiplex mode or a broadcast mode in individual time slots, it should be noted that in addition a multicast mode may be provided for, wherein control circuit 16 controls the RF multiplexers to pass RF pulses to selectable of predetermined subsets of N' of the N output transmission lines 28 (1<N'<N). In this way a more flexible way of increasing the number of applied RF pulses may be realized. In this embodiment or separately, control circuit 16 may be configured to control different ones of the M time division multiplexing systems differently, for example by switching part to the M time division multiplexing systems in the broadcast mode and another part in the multiplexing mode in the same time slot. In this way a more flexible way of increasing the number of applied RF pulses may be realized. As another example, control circuit 16 may be configured to make different multicast selections in for different M time division multiplexing systems in the same time slot.

The described system may be part of a quantum computation circuits, wherein the qubit circuits are used as processing and storage elements, for processing and/or storing superimposed information for use in superimposed bit computations. As noted, various examples of qubit circuits are known under the names of Cooper pair box, Transmon, Quantronium, Fluxonium, as well as from US2009015317. The term qubit circuit covers both circuits wherein waveguide structures or cavities are used to carry RF electromagnetic wave fields in the qubit circuit as well as RF circuits wherein lump capacitors and/or inductors connected by conductors are used. In most instances the qubit circuit comprises a superconducting resonant RF circuit with a resonance frequency in the microwave range, for example in a range of 1-10 Gigahertz Due to quantum mechanic effects oscillations at the resonance frequency of such a resonant circuit can be excited only at discrete energy levels, corresponding to different states. Different states are used to represent different computational values in the quantum computation circuit One important effect in qubits is decoherence. In the course of time a qubit loses coherence, e.g. do to external noise, after which it becomes useless (i.e. its data is effectively lost). Superconductive RF qubit circuits enable coherence over sufficient time to enable use of the qubits for computation. Nevertheless, coherence still imposes a limit on their use, which can be expressed in terms of a coherence time distance, which may be defined as the maximum time distance between RF pulses that is possible without detracting from the possibility of computational use. The usefulness of a qubit system to perform a computational task may depend on the ability to apply a sufficient number of RF pulses of the task to qubits in the system within the coherence time distance. The RF pulses may have a duration of 10-40 nanoseconds, e.g. 20-40 nanoseconds, whereas the coherence time distance may be longer, at least a few microseconds, or tens or hundreds of microseconds.

Undesired state transitions of the qubits form another problem. Such transitions can be suppressed by using complex pulse shapes, obtained by applying different pulse modulation to in-phase and quadrature components of the carrier signal from which the RF pulse is generated. However, this creates a further sensitivity to inaccuracies of RF pulse modulation and qubit manufacturing tolerances.

The invention claimed is:

1. A qubit circuit system comprising:
a plurality of N groups of M qubit circuits, wherein N and M are a first and second integers greater than one;
a plurality of N RF transmission structures, each corresponding to a respective one of the groups of qubit circuits;
a plurality of N groups of M frequency selective filters, each group of frequency selective filters being coupled between a respective one of the N RF transmission structures and its corresponding group of qubit circuits, the M frequency selective filters in each group of frequency selective filters being configured for selectively passing RF signals at respective different pass frequencies to respective ones of the qubit circuits in the corresponding group;
a plurality of M time division multiplexing systems, each time division multiplexing system comprising an RF pulse generator and a controllable one-to-N multiplexer with an input coupled to an output of the RF pulse generator, the RF pulse generators of each of the time division multiplexing systems being operable to produce RF pulses containing undulations at a respective one of the pass frequencies of the M frequency selective filters in the groups of frequency selective filters;
a plurality of N RF combiners, each having M inputs coupled to outputs of the one-to-N multiplexers of each of the M time division multiplexing systems, each RF combiner having an output coupled to a respective one of the RF transmission structures; and
a control circuit having first control outputs coupled to modulation inputs of the RF pulse generators and second control outputs coupled to control inputs of the controllable one-to-N multiplexers, the control circuit being configured to control successive transmission of simultaneous RF pulses from the RF pulse generators, and to control the controllable one-to-N multiplexers to pass individual ones of the RF pulses to selectable ones of the outputs of the one-to-N multiplexers in a multiplexing mode.

2. A system according to claim 1, wherein the control circuit is configured to control the one-to-N multiplexer of at least one of the time division multiplexing systems selectably alternatively in the multiplexing mode and a broadcast mode, wherein the one-to-N multiplexer passes an RF pulse from the RF pulse generator of at the least one of the time division multiplexing systems to all outputs of the one-to-N multiplexer of the at least one of the time division multiplexing system.

3. A system according to claim 1, wherein the control circuit is configured to control the one-to-N multiplexer of at least one of the time division multiplexing systems selectably alternatively in the multiplexing mode and a multicast mode, wherein the one-to-N multiplexer passes an RF pulse from the RF pulse generator of at the least one of the time division multiplexing systems to outputs of a subset containing a plurality of the one-to-N multiplexers of the at least one of the time division multiplexing systems.

4. A system according to claim 1, comprising amplitude adapter circuits in RF signal paths from the time division multiplexing systems to the inputs of the RF combiner, the control circuit comprising third control outputs coupled to control inputs of amplitude adapter circuits for individually controlling amplitude adaptation by individual ones of the amplitude adapter circuits.

5. A system according to claim 1, wherein the RF pulse generator of each of the time division multiplexing systems comprises:
a local RF oscillator and
a first and second mixer with inputs coupled to the local RF oscillator,
the time division multiplexing system comprising:
a further controllable one-to-N multiplexer, inputs of the controllable one-to-N multiplexer and the further controllable one-to-N multiplexer being coupled to outputs of the first and second mixer respectively,
controllable amplitude adapter circuits in RF signal paths from outputs of the controllable one-to-N multiplexer and/or in RF signal paths from outputs of the further controllable one-to-N multiplexer to the inputs of the RF combiners,
the control circuit comprising third control outputs coupled to control inputs of at least part of the amplitude adapter circuits for individually controlling adaptation of an amplitude ratio between RF pulse amplitudes of RF pulses passed by the controllable one-to-N multiplexer and further controllable one-to-N multiplexer.

6. A system according to claim 4, comprising controllable phase adapters in series with the amplitude adapters, the control circuit comprising fourth control outputs coupled to control inputs of at least part of the amplitude adapter circuits, for individually controlling adaptation of a phase difference between RF pulses passed by the controllable one-to-N multiplexer and further controllable one-to-N multiplexer.

7. A method of controlling qubit circuit state changes, of qubit circuits in a plurality of N groups of M qubit circuits, wherein N and M are a first and second integers greater than one, the method comprising:
generating successive sets of M RF pulses simultaneously, each set containing M RF pulses at different RF frequencies;
in a multiplexing mode, using M switching multiplexer circuits each to pass a respective one of the M RF pulses in the set to a selected one of a plurality of N M-to-one RF combiners;
transmitting combined RF pulses at M different RF frequencies from each of the N combiner to a transmission structure for a respective one of the groups; and
coupling individual ones of the combined RF pulses from the transmission structure for the group to respective ones of the qubit circuits of the groups via respective frequency selective filters.

8. A method of controlling qubit circuit state changes according to claim 7, switching to a broadcast mode for part of the sets and switching the M multiplexer circuits each to pass a respective one of the M RF pulses in the set to all of the plurality of N M to one RF combiners.

9. A method of controlling qubit circuit state changes according to claim 7, switching to a multicast mode for part of the sets and switching the M multiplexer circuits each to pass a respective one of the M RF pulses in the set to a multicast subset of the plurality of N M-to-one RF combiners, the multicast subset comprising a plurality of the RF combiners.

10. A method according to claim 7, comprising controlling amplitude adaptation of the RE pulses between the M switching multiplexer circuit and the RF combiners.

11. A method according to claim 7, comprising
generating successive sets of M collections of RF pulses simultaneously, each collection comprising a first and second different RF pulse at the same frequency simultaneously, different collections in the set containing different RF frequencies;
in the multiplexing mode, using 2*M switching multiplexer circuits each to pass a respective first and second RF pulses in the set to a corresponding selected ones of the plurality of N M-to-one RF combiners; and
transmitting combined RF pulses at M different RF frequencies containing the first and second RE pulse signals to the transmission structure for a respective one of the groups.

12. A method according to claim 10, comprising controlling adaptation of a ratio of amplitudes of the first and second RF pulses between the M switching multiplexer circuits and the RF combiners.

\* \* \* \* \*